(12) United States Patent
Sakurai et al.

(10) Patent No.: US 11,831,060 B2
(45) Date of Patent: Nov. 28, 2023

(54) HIGH-FREQUENCY TRANSMISSION LINE

(71) Applicant: DENSO CORPORATION, Kariya (JP)

(72) Inventors: Kazumasa Sakurai, Nisshin (JP);
Kazuya Wakita, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 16/795,994

(22) Filed: Feb. 20, 2020

(65) Prior Publication Data

US 2020/0194858 A1 Jun. 18, 2020

Related U.S. Application Data

(63) Continuation of application No. PCT/JP2018/031149, filed on Aug. 23, 2018.

(30) Foreign Application Priority Data

Aug. 24, 2017 (JP) ................................. 2017-161276

(51) Int. Cl.
*H01P 3/08* (2006.01)
(52) U.S. Cl.
CPC ...................... *H01P 3/08* (2013.01)
(58) Field of Classification Search
CPC ........................................................... H01P 3/08
See application file for complete search history.

(56) References Cited

U.S. PATENT DOCUMENTS

| 5,930,665 | A  | * | 7/1999  | Cho ........................ H01L 23/66 438/612 |
| 8,212,154 | B2 | * | 7/2012  | Kashiwakura ....... H05K 1/0251 174/262 |
| 2006/0255876 | A1 | * | 11/2006 | Kushta ................... H05K 1/024 333/33 |
| 2009/0133913 | A1 | * | 5/2009  | Kushta ................. H05K 1/0222 174/250 |
| 2010/0282503 | A1 |   | 11/2010 | Kushta |
| 2013/0235542 | A1 | * | 9/2013  | Song .................... H05K 1/0243 361/773 |

FOREIGN PATENT DOCUMENTS

| JP | 2015-050680 A | 3/2015 |
| JP | 2015-056719 A | 3/2015 |

* cited by examiner

*Primary Examiner* — Samuel S Outten
(74) *Attorney, Agent, or Firm* — MASCHOFF BRENNAN

(57) ABSTRACT

A high-frequency transmission line includes a multi-layer substrate, a plurality of line portions, a plurality of signal vias, a ground plane, and a plurality of metal portions. When a high-frequency signal that is transmitted through each of the plurality of line portions is transmitted through the transmission area corresponding to each of the plurality of line portions, the plurality of metal portions confine the high-frequency signal in the transmission area. The plurality of metal portions pass through at least a single dielectric layer, are electrically continuous with the ground plane. The plurality of metal portions are formed along the transmission direction and are arranged in an alternating manner with each of the plurality of signal vias so as to sandwich each of the plurality of signal vias in a direction differing from the transmission direction.

12 Claims, 11 Drawing Sheets

HIGH-FREQUENCY TRANSMISSION LINE

CROSS-REFERENCE TO RELATED APPLICATIONS

The present application is a continuation application of International Application No. PCT/JP2018/031149, filed Aug. 23, 2018, which claims priority to Japanese Patent Application No. 2017-161276, filed Aug. 24, 2017. The contents of these applications are incorporated herein by reference in their entirety.

BACKGROUND

Technical Field

The present disclosure relates to a technology for transmitting a high-frequency signal in a lamination direction of a multi-layer substrate.

Related Art

A known high-frequency transmission line includes a multi-layer wiring substrate, signal line patterns, a signal via, and a ground via. The signal line patterns are formed on both surfaces of the multi-layer wiring substrate. The signal via connects the signal line patterns. The ground via has ground potential and is arranged along a circle that centers on the signal via. In the high-frequency transmission line, high-frequency signal can be transmitted in the lamination direction of the multi-layer wiring substrate with low loss.

SUMMARY

A high-frequency transmission line according to an aspect of the present disclosure includes a multi-layer substrate, a plurality of line portions, a plurality of signal vias, a ground plane, and a plurality of metal portions. The plurality of metal portions passes through at least a single dielectric layer, are electrically continuous with the ground plane, are formed along the transmission direction, and are arranged in an alternating manner with each of the plurality of signal vias so as to sandwich each of the plurality of signal vias in a direction differing from the transmission direction.

DESCRIPTION OF THE EMBODIMENTS

Figure 1:
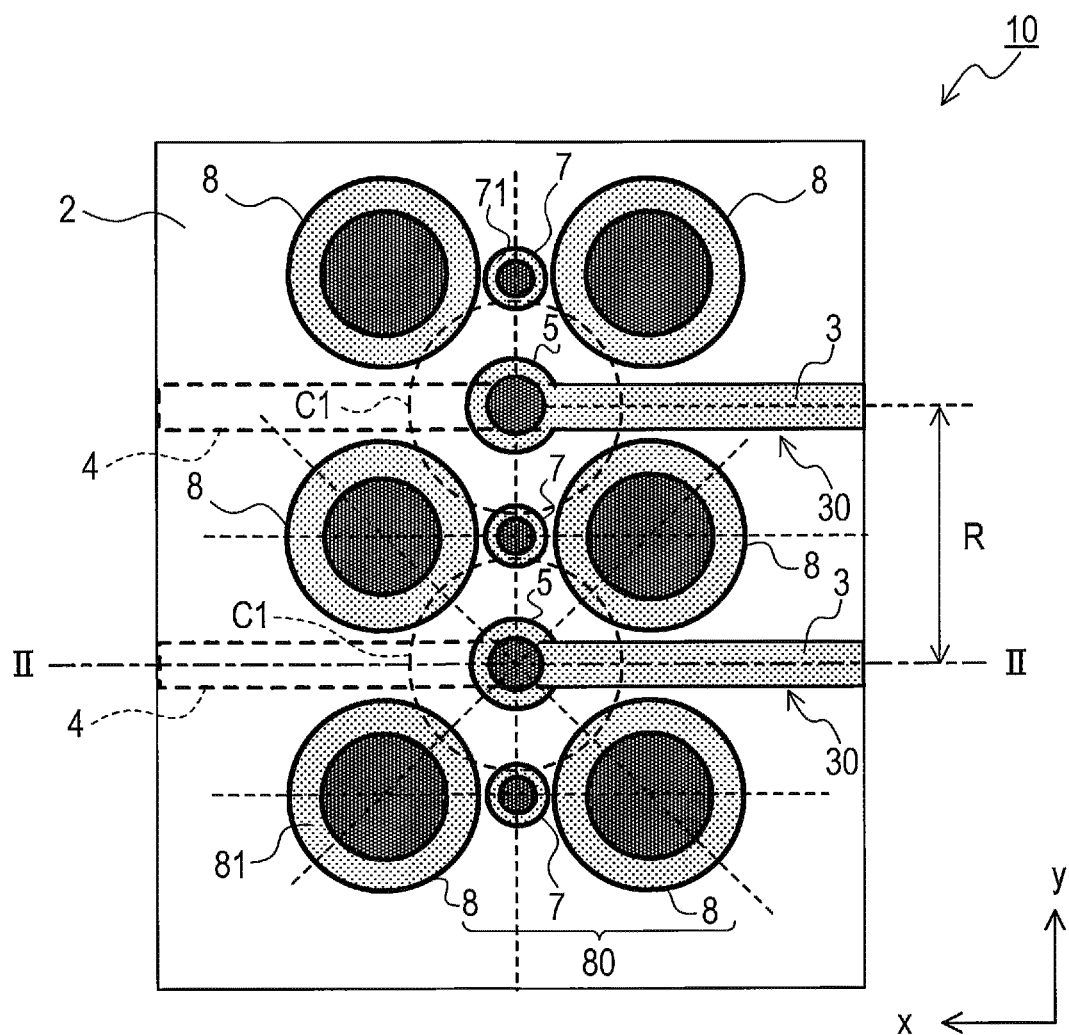
FIG. 1 is a plan view of a high-frequency transmission line according to a first embodiment.

JP-A-2015-050680 describes a technology in which a high-frequency transmission line is formed by signal line patterns that are formed on both surfaces of a multi-layer wiring substrate being connected by a signal via, and a ground via that has ground potential being arranged along a circle that centers on the signal via. When the high-frequency transmission line that is formed in this manner is used, the high-frequency signal can be transmitted in the lamination direction of the wiring substrate with low loss.

When the above-described high-frequency transmission line is applied to power supply of an antenna that has a plurality of antenna elements, particularly a wide-angle antenna, to suppress grating lobes, an interval between signal lines that supply power to the antenna elements is preferably equal to or less than half of a wavelength. However, as a result of detailed review by the inventors, an issue has been found in that, when a plurality of high-frequency transmission lines are arranged side-by-side, if the interval between signal lines is sufficiently narrowed, the ground vias of adjacent high-frequency transmission lines overlap each other. Therefore, the interval between signal lines cannot be sufficiently narrowed. That is, as a result of detailed review by the inventors, an issue has been found in that, even when a plurality of the above-described high frequency power lines are arranged side-by-side, it is difficult to apply the high-frequency transmission lines to power supply of an antenna that has a plurality of antenna elements because the interval between signal lines cannot be sufficiently narrowed.

It is thus desired to provide a high-frequency transmission line that can be applied to power supply of an antenna that has a plurality of antenna elements.

A high-frequency transmission line according to an exemplary embodiment of the present disclosure includes a multi-layer substrate, a plurality of line portions, a plurality of signal vias, a ground plane, and a plurality of metal portions. The multi-layer substrate includes a plurality of dielectric layers that are laminated. The plurality of line portions are placed side-by-side in a direction that differs from a transmission direction that is set in advance. Each of the plurality of line portions includes a signal line that is formed along the transmission direction on each of two outer surfaces of the multi-layer substrate. Each of the plurality of signal vias is arranged in each of the plurality of line portions, and connects between the signal lines that are respectively formed on the two outer surfaces. The ground plane is included in the multi-layer substrate, arranged between the plurality of dielectric layers, and covers peripheries of a plurality of transmission areas that are areas that center on each of the plurality of signal vias.

The plurality of metal portions are provided such that, when a high-frequency signal that is transmitted through each of the plurality of line portions is transmitted through the transmission area corresponding to each of the plurality of line portions, the high-frequency signal is confined in the transmission area. The plurality of metal portions pass through at least a single dielectric layer in a lamination direction, are electrically continuous with the ground plane, are formed along the transmission direction, and are arranged in an alternating manner with each of the plurality of signal vias so as to sandwich each of the plurality of signal vias in the direction differing from the transmission direction.

In the high-frequency transmission line according to the exemplary embodiment, the plurality of metal portions are formed along the transmission direction in a manner similar to the signal line that is connected to each of the plurality of signal vias. In addition, the plurality of metal portions are arranged in an alternating manner with each of the plurality of signal vias so as to sandwich each of the plurality of signal vias in the direction that differs from the transmission direction. Therefore, the signal vias that are adjacent to each other with the metal portion therebetween can share the metal portion that is present therebetween and configure a quasi-coaxial line structure.

As a result, compared to a case in which the metal portion is arranged along a circle for each signal via, an interval between a plurality of line portions can be sufficiently narrowed. Furthermore, the metal portion is arranged between adjacent signal vias. Therefore, reduction in transmission loss and high isolation of adjacent signal vias can be obtained. Consequently, the high-frequency transmission line according to an aspect of the present disclosure can be applied to power supply of an antenna that has a plurality of antenna elements.

Embodiments for implementing the present disclosure will hereinafter be described with reference to the drawings.

1. First Embodiment

[1-1. Configuration]

A high-frequency transmission line 10 according to a present embodiment is assumed to be applied to power supply to each antenna element of a wide angle-antenna that has two antenna elements. In addition, the high-frequency transmission line 10 is assumed to be applied to transmission of high-frequency signals of which a frequency is equal to or higher than 50 GHz.

Figure 2:
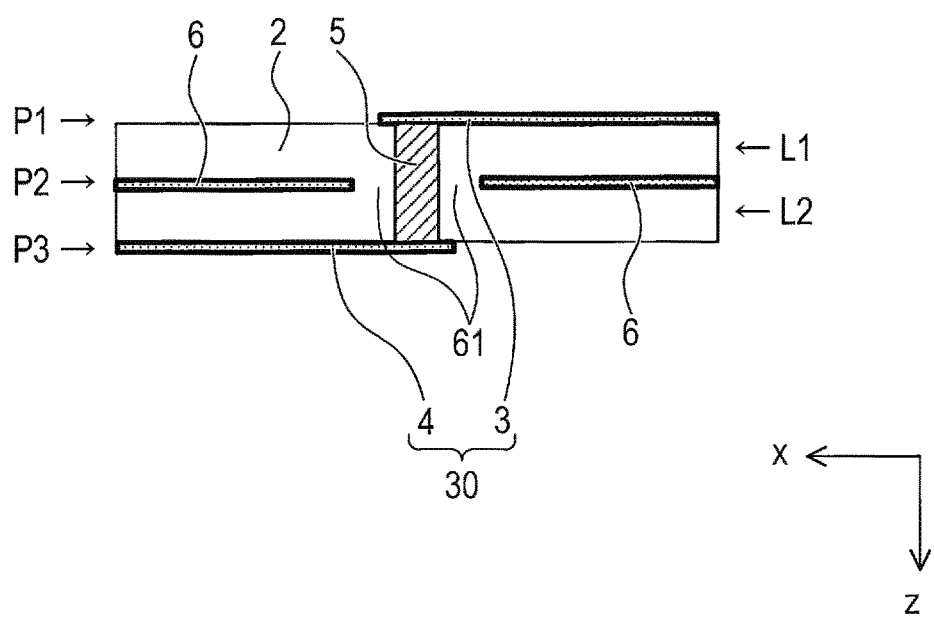
FIG. 2 is a cross-section view taken along line II-II in FIG. 1.

First, a configuration of the high-frequency transmission line 10 will be described with reference to FIG. 1 and FIG. 2. The high-frequency transmission line 10 includes a multi-layer substrate 2, two line portions 30, two signal vias 5, and three ground via portions 80. Hereafter, directions that are parallel to a plane of the multi-layer substrate 2 are an x direction and a y direction. A direction that is perpendicular to the plane of the multi-layer substrate 2 is a z direction. The x direction and the y direction are directions that are perpendicular to each other. In addition, the x direction is a transmission direction of the high-frequency signal on the plane of the multi-layer substrate 2.

The multi-layer substrate 2 includes two dielectric layers L1 and L2, and three pattern layers P1 to P3 that sandwich the dielectric layers L1 and L2. Hereafter, among the pattern layers P1 to P3, the pattern layers P1 and P3 that are arranged on outer surfaces of the multi-layer substrate 2 are referred to as outer layers. The pattern layer P2 that is arranged between the dielectric layers L1 and L2 is referred to as an intermediate layer.

Each of the two line portions 30 includes a signal line 3 and a signal line 4 that serve as waveguides that transmit the high-frequency signal. The signal line 3 is a conductor pattern that is formed on the outer layer P1 along the transmission direction. The signal line 4 is a conductor pattern that is formed on the outer layer P3 along the transmission direction. For example, copper foil that is formed by etching or the like is used as the signal lines 3 and 4. The two signal lines 3 are placed side-by-side in the y direction on the outer layer P1. An interval between adjacent signal lines 3 is a distance R. In addition, the two signal lines 4 are placed side-by-side in the y direction on the outer layer P3. The interval between centers of the adjacent signal layers 4 is the distance R. Furthermore, tip ends of the signal lines 3 and 4 that are included in the single signal portion 30 are arranged in positions opposite to each other with the dielectric layers L1 and L2 between the tip ends of the signal lines 3 and 4.

Each of the two signal vias 5 is a metal conductor. The two signal vias 5 are respectively arranged in the two line portions 30. The signal via 5 connects the tip end of the signal line 3 and the tip end of the signal line 4 that are opposite to each other. The two signal vias 5 are arranged in a row in the y direction. An interval between centers of adjacent signal vias 5 is the distance R. In addition, a diameter of each signal via 5 is formed to be less than the distance R and greater than a line width of the signal lines 3 and 4.

A ground plane 6 is a conductor pattern that is formed on the intermediate layer P2 using copper foil or the like. The ground plane 6 is connected to ground potential. The ground plane 6 covers peripheries of two transmission areas 61 among planes with which the two dielectric layers L1 and L2 are in contact. That is, the ground plane 6 is formed to cover an overall area excluding the two transmission areas 61. The two transmission areas 61 are areas that respectively center on the two signal vias 5. According to the present embodiment, the two transmission areas 61 are circular areas that center on the two signal vias 5.

Each of the two line portions 30 and the transmission area 61 that corresponds to each line portion 30 serve as a power supply line to each of the two antenna elements. That is, the power supply lines of the antenna elements are formed to be placed side-by-side in the y direction at an interval of the distance R. The distance R is a distance that is equal to or less than half of the wavelength of the high-frequency signal that is transmitted on the high-frequency transmission line 10. According to the present embodiment, the high-frequency transmission line 10 transmits a high-frequency signal of 77 GHz. In addition, the wavelength herein refers to an effective wavelength.

Each of the three ground via portions 80 is formed along the x direction. In addition, each of the three ground via portions 80 is arranged in an alternating manner with each of the two signal vias 5 in the y direction, so as to sandwich each of the two signal vias 5. Each of the three ground via portions 80 is a metal member that, when the high-frequency signal that is transmitted through each line portion 30 is transmitted through the transmission area 61 in the periphery of the signal via 5 that corresponds to each line portion 30, confines the high-frequency signal in the transmission area. That is, the three ground via portions 80 are metal members for forming a quasi-coaxial line structure by the signal via 5 and the two ground via portions 80 that are arranged to sandwich the signal via 5.

Each of the three ground via portions 80 includes a single small ground via 7, and two large ground vias 8 of which a diameter is greater than that of the small ground via 7. The small ground via 7 and the large ground vias 8 pass through the multi-layer substrate 2 in a lamination direction and are electrically continuous with the ground plane 6. According to the present embodiment, a diameter of the signal via 5 is formed to be greater than the diameter of the small ground via 7 and smaller than the diameter of the large ground via 8. In addition, according to the present embodiment, the ground via portion 80 corresponds to a metal portion.

The single small ground via 7 and the two large ground vias 8 that are included in the same ground via portion 80 are arranged in the x direction such that the two large ground vias 8 sandwich the small ground via 7. In addition, a center of the small ground via 7 and centers of the two large ground vias 8 are arranged to be positioned on the same line.

Furthermore, in a row in which the two signal vias 5 are arranged, the three small vias 7 in the three ground via portions 80 are each arranged to sandwich each of the two signal vias 5. In other words, the centers of the three small ground vias 7 and the centers of the two signal vias 5 are arranged on the same line.

In addition, the two ground via portions 80 that sandwich each of the two signal vias 5 are configured so as to be linearly symmetrical with the signal lines 3 and 4 that are connected to the sandwiched signal via 5. Here, the two signal vias 5 are a first signal via and a second signal via. The ground via portion 80 between the first signal via and the second signal via is referred to as a second ground via portion. The ground via portion 80 that sandwiches the first signal via together with the second ground via portion is referred to as the first ground via portion. The remaining ground via portion 80 is referred to as a third ground via portion. The second ground via portion is linearly symmetrical with the first ground via portion relative to the signal lines 3 and 4 that are connected to the first signal via. In addition, the second ground via portion is linearly symmetrical with the third ground via portion relative to the signal lines 3 and 4 that are connected to the second signal via.

Furthermore, the two small ground vias 7 and the four large ground vias 8 that are included in the two ground via portions 80 that sandwich each of the two signal vias 5 are arranged on a circle C1 that centers on the sandwiched signal via 5. That is, the first ground via portion and the second ground via portion are arranged on the circle C1 that centers on the first signal via. The second ground via portion and the third ground via portion are arranged on the circle C1 that centers on the second signal via. The second ground via portion is arranged on both the circle C1 that centers on the first signal via and the circle C1 that centers on the second signal via. Therefore, the second ground via portion is shared between the adjacent first signal via and second signal via.

Specifically, each small ground via 7 and each large ground via 8 are arranged such that a portion of a land of the small ground via 7 and a portion of a land of the large ground via 8 is positioned on the circle C1 that centers on the signal via 5.

When the high-frequency transmission line 10 that is configured in this manner is used to supply power to an antenna, when the high-frequency signal is supplied from each of the two signal lines 4, each of the supplied high-frequency signals is transmitted from the signal line 4 to the signal line 3 via the transmission area 61, and supplied to each antenna element.

[1-2. Effects]

According to the first embodiment described above, the following effects are obtained.

(1) In a manner similar to the two line portions 30, the three ground via portions 80 are formed along the transmission direction. In addition, each of the three ground via portions 80 is arranged in an alternating manner with each of the two signal vias 5 in a direction that differs from the transmission direction, so as to sandwich each of the two signal vias 5. Therefore, the signal vias 5 that are adjacent to each other with the ground via portion 80 therebetween can share the ground via portion 80 that is present therebetween. As a result, compared to a case in which the ground via portion 80 is set along a circle for each signal via 5, the interval between two line portions 30 can be sufficiently narrowed. In addition, the ground via portion 80 is arranged between adjacent signal vias 5. Therefore, reduction in transmission loss and high isolation of each of the adjacent signal vias 5 can be obtained. Consequently, power may be supplied to an antenna having a plurality of antenna elements.

(2) The two adjacent signal vias 5 can share the single small ground via 7 and the two large ground vias 8 that are arranged between the two adjacent signal vias 5 and placed side-by-side along the transmission direction.

(3) Each ground via portion 80 includes the small ground via 7 and the large ground vias 8 of which the diameters differ. Therefore, the small ground via 7 and the large ground vias 8 can be placed side-by-side in a direction along the transmission direction and arranged on a circle that centers on the signal via 5. Consequently, effects of the quasi-coaxial line structure that is configured by the signal vias 5, the small ground vias 7, and the large ground vias 8 can be improved.

(4) The three small ground vias 7 are arranged in the row in which the two signal vias 5 are arranged. Consequently, the interval between two signal vias 5 and, furthermore, the interval between two line portions 30 can be narrowed.

(5) The two ground via portions that sandwich the signal via 5 are formed to be linearly symmetrical with the signal lines 3 and 4 that are connected to the signal via. Consequently, transmission performance regarding high-frequency signals can be improved.

(6) Even when a high-frequency signal of a high frequency that is equal to or higher than 50 GHz is transmitted, the intervals between the two signal vias 5 and the two line portions 30 can be sufficiently narrowed.

(7) The intervals between the two signal vias 5 and the two line portions 30 can be set to a distance that is equal to or less than half of the wavelength of the high-frequency signal. Therefore, when the high-frequency transmission line 10 is applied to power supply of an antenna that has two antenna elements, the occurrence of grating lobes can be suppressed. Moreover, the high-frequency transmission line 10 can be suitably applied to power supply of a wide-angle antenna.

[1-3. Simulation]

Figure 3:
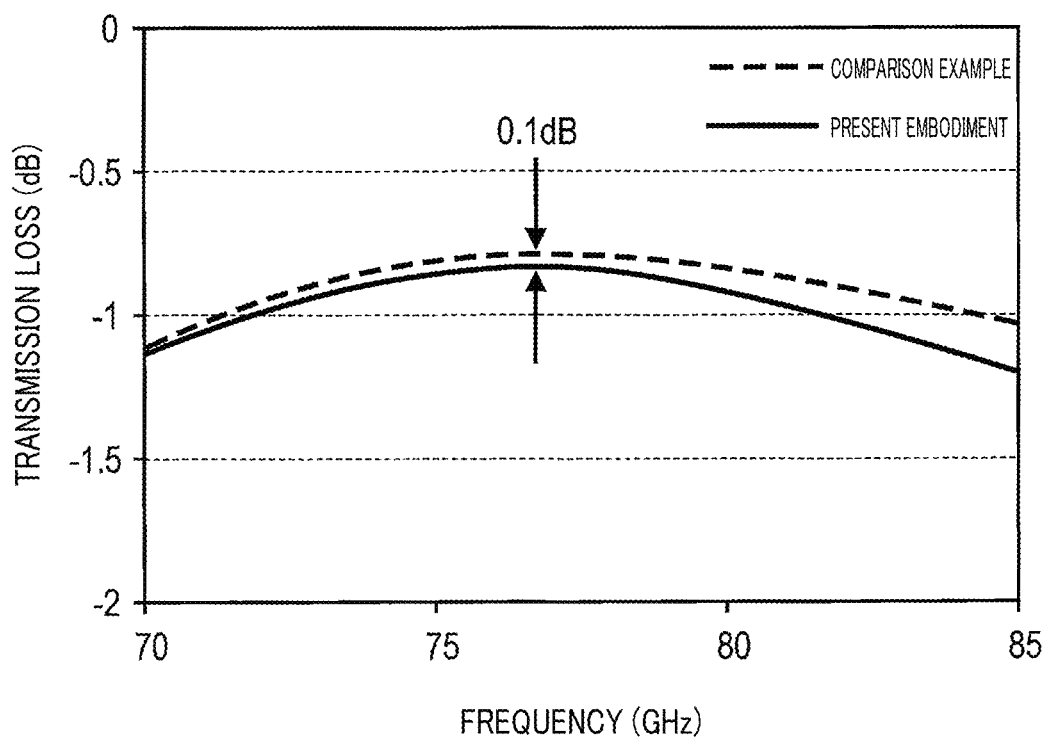
FIG. 3 is a graph of transmission loss relative to frequency, determined through simulation.

FIG. 3 is a graph of the results of transmission loss in the high-frequency transmission line 10 determined through simulation. For comparison, characteristics of a comparison example in which a plurality of ground vias are arranged along a circle that centers on the signal via are also shown. The transmission loss herein includes loss that occurs during transmission through the signal lines 3 and 4 and the transmission area 61. From FIG. 3, it is clear that a difference between the present embodiment in which the plurality of ground vias are arranged along the x direction and the comparison example in which the plurality of ground vias are arranged along a circle that is centered on the signal via 5 is merely a difference of about 0.1 dB. Therefore, it is clear that the present embodiment obtains transmission performance to an extent that is similar to that of the comparison example.

Figure 4:
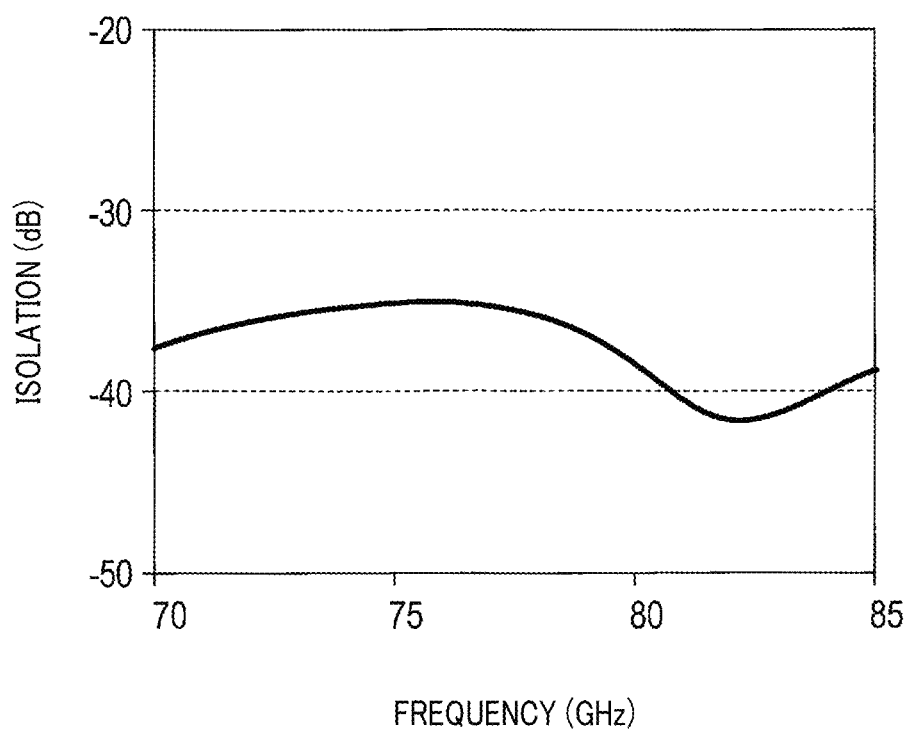
FIG. 4 is a graph of isolation relative to frequency, determined through simulation.
Figure 5:
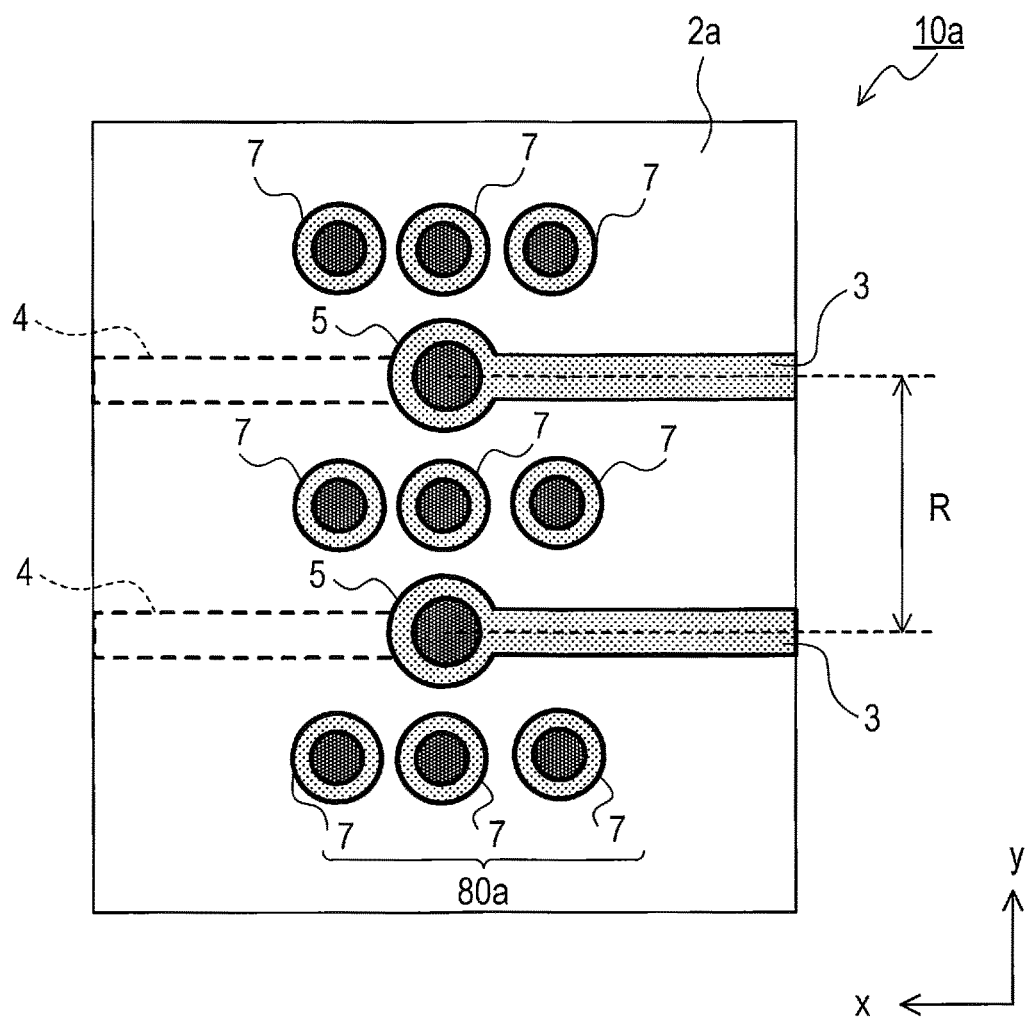
FIG. 5 is a plan view of a high-frequency transmission line according to a second embodiment.

In addition, FIG. 4 is a graph of electric power of the high-frequency signal that is leaked to an other line portion 30, when the high-frequency signal is supplied to one line portion 30 of the two line portions 30. From FIG. 4, it is clear that leakage of the high-frequency signal to the adjacent line portion 30 is sufficiently suppressed. That is, it is clear that, when the high-frequency transmission line 10 is applied to power supply to two antenna elements, sufficient isolation between the two antenna elements can be obtained.

Second Embodiment

[2-1. Differences with the First Embodiment]

A basic configuration according to a second embodiment is similar to that according to the first embodiment. Therefore, descriptions of shared configurations are omitted. Differences will mainly be described. Here, reference numbers that are the same as those according to the first embodiment indicate the same configurations and preceding descriptions are referenced.

In the high-frequency transmission line 10 according to the first embodiment, described above, the ground via portion 80 that includes the single small ground via 7 and the two large ground vias 8 is formed in the multi-layer substrate 2. In this regard, a high-frequency transmission line 10a according to the second embodiment differs from that according to the first embodiment in that a ground via portion 80a that includes three small ground vias 7 is formed in a multi-layer substrate 2a. That is, in the ground via portion 80a, the small ground vias 7 are arranged even in the positions of the large ground vias 8 in the ground via portion 80.

Therefore, in the high-frequency transmission line 10a, the six small ground vias that are included in the two ground via portions 80a that sandwich the signal via 5 are not arranged on the circle C1 that is centered on the signal via 5. Therefore, the high-frequency transmission line 10a does not obtain the effect of reducing transmission loss to the extent of the high-frequency transmission line 10. However, because each of the three ground via portions 80a are arranged so as to sandwich each of the two signal vias 5, the effect of reducing transmission loss to a certain extent is obtained.

[2-2. Effects]

According to the second embodiment described above, the above-described effects (1) and (2), and (4) to (7) according to the first embodiment are obtained.

3. Third Embodiment

[3-1. Differences with the First Embodiment]

A basic configuration according to a third embodiment is similar to that according to the first embodiment. Therefore, descriptions of shared configurations are omitted. Differences will mainly be described. Here, reference numbers that are the same as those according to the first embodiment indicate the same configurations and preceding descriptions are referenced.

Figure 6:
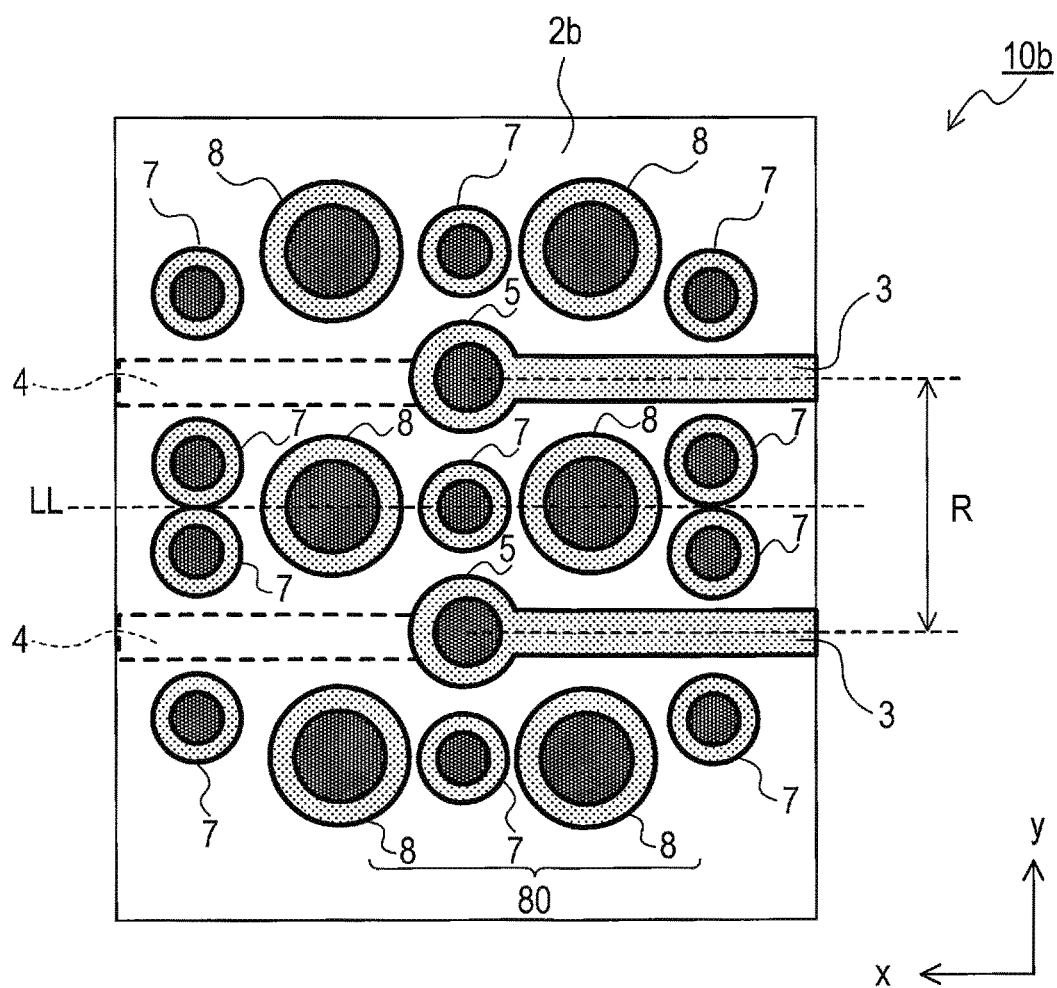
FIG. 6 is a plan view of a high-frequency transmission line according to a third embodiment.

A high-frequency transmission line 10b according to the third embodiment differs from that according to the first embodiment in that the small ground via 7 is further added than that in the above-described high-frequency transmission line 10 according to the first embodiment. As shown in FIG. 6, in addition to the three ground via portions 80, eight small ground vias 7 are formed in the multi-layer substrate 2b of the high-frequency transmission line 10b.

Here, among the three ground via portions 80, the ground via portion 80 that is arranged in the middle of the two signal vias 5 is an intermediate ground via portion. The remaining two ground via portions 80 are outer ground via portions. Among the added eight small ground vias 7, four are arranged on both sides of the two outer ground via portions in the x direction, one on each side of each outer ground via portion. In addition, the remaining four small ground vias 7 are arranged on both sides of the intermediate ground via portion in the x direction, two on each side. Furthermore, the eight small ground vias 7 are arranged so as to be linearly symmetrical with a center line LL. The center line LL is a line that passes through the centers of the single small ground via 7 and the two large ground vias 8 that are included in the intermediate ground via portion. That is, in the high-frequency transmission line 10b, four small ground vias 7 are added for each signal via 5, compared to the high-frequency transmission line 10.

[3-2. Effects]

According to the third embodiment described above, the above-described effects (1) to (7) according to the first embodiment are obtained. In addition, as a result of the number of the small ground vias 7 being increased from that according to the first embodiment, transmission loss can be further reduced than that according to the first embodiment.

4. Fourth Embodiment

[4-1. Differences with the First Embodiment]

A basic configuration according to a fourth embodiment is similar to that according to the first embodiment. Therefore, descriptions of shared configurations are omitted. Differences will mainly be described. Here, reference numbers that are the same as those according to the first embodiment indicate the same configurations and preceding descriptions are referenced.

Figure 7:
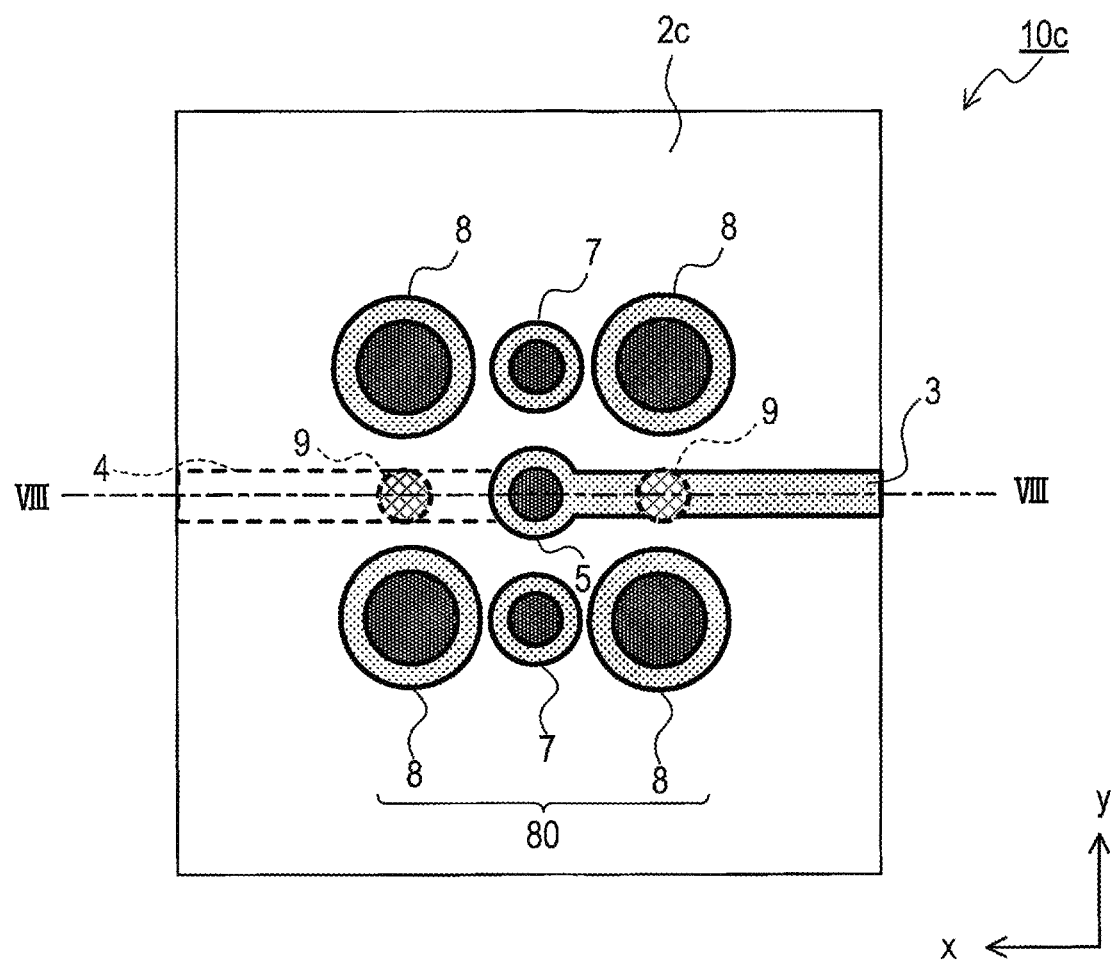
FIG. 7 is a plan view of a high-frequency transmission line according to a fourth embodiment.

As shown in FIG. 7, a high-frequency transmission line 10c according to the fourth embodiment differs from that according to the first embodiment in that an inter-layer via 9 is further added. In FIG. 7, a portion of the high-frequency transmission line 10c is omitted, and a single signal via 5 and the two ground via portions 80 that sandwich the signal via 5 are shown. In actuality, the high-frequency transmission line 10c includes the two signal vias 5, the two line portions 30, and the three ground via portions 80, in a manner similar to the high-frequency transmission line 10.

Figure 8:
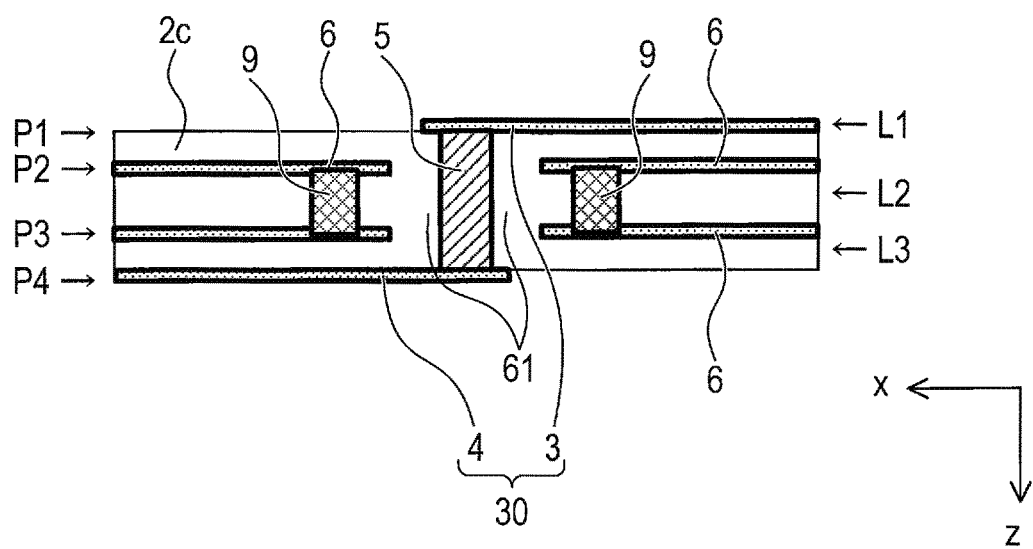
FIG. 8 is a cross-section view taken along line VIII-VIII in FIG. 7.

As shown in FIG. 7 and FIG. 8, the multi-layer substrate 2c of the high-frequency transmission line 10c includes three dielectric layers L1 to L3, and four pattern layers P1 to P4 that sandwich each of the dielectric layers L1 to L3. Hereafter, among the pattern layers P1 to P4, the pattern layers P1 and P4 that are arranged on the outer surfaces of the multi-layer substrate 2 is referred to as the outer layers. The other pattern layers P2 and P3 are referred to as intermediate layers.

The two line portions 30 are formed in the outer layers P1 and P4. In addition, the ground plane 6 is formed in each of the intermediate layers P2 and P3. Furthermore, in the multi-layer substrate 2c, two inter-layer vias 9 are formed for each line portion 30. Each of the inter-layer vias 9 is formed to pass through the dielectric layer L2 and provide electrical continuity between the two ground planes 6 that are formed in the intermediate layers P2 and P3.

In addition, the two inter-layer vias 9 that are formed for each line portion 30 are arranged in positions that overlap the signal lines 3 and 4 on an xy plane. One of the two inter-layer vias 9 is arranged in a position that overlaps the signal line 3, and the remaining one is arranged in a position that overlaps the signal line 4. That is, the inter-layer vias 9 are formed in positions in which the inter-layer vias 9 are unable to pass completely through the multi-layer substrate 2 because the line portions 30 are formed in the outer layers P1 and P4.

[4-2. Effects]

According to the fourth embodiment described above, the above-described effects (1) to (7) according to the first embodiment are obtained. In addition, as a result of the inter-layer vias 9 being added, transmission loss can be further reduced than that according to the first embodiment.

5. Fifth Embodiment

[5-1. Differences with the Fourth Embodiment]

A basic configuration according to a fifth embodiment is similar to that according to the fourth embodiment. Therefore, descriptions of shared configurations are omitted. Differences will mainly be described. Here, reference numbers that are the same as those according to the first embodiment indicate the same configurations and preceding descriptions are referenced.

In a high-frequency transmission line 10d according to the fifth embodiment as well, the two inter-layer vias 9 are formed for each line portion 30. However, the high-frequency transmission line 10d according to the fifth embodiment differs from that according to the fourth embodiment in that each inter-layer via 9 is exposed from one of the two outer surfaces of a multi-layer substrate 2d.

Figure 9:
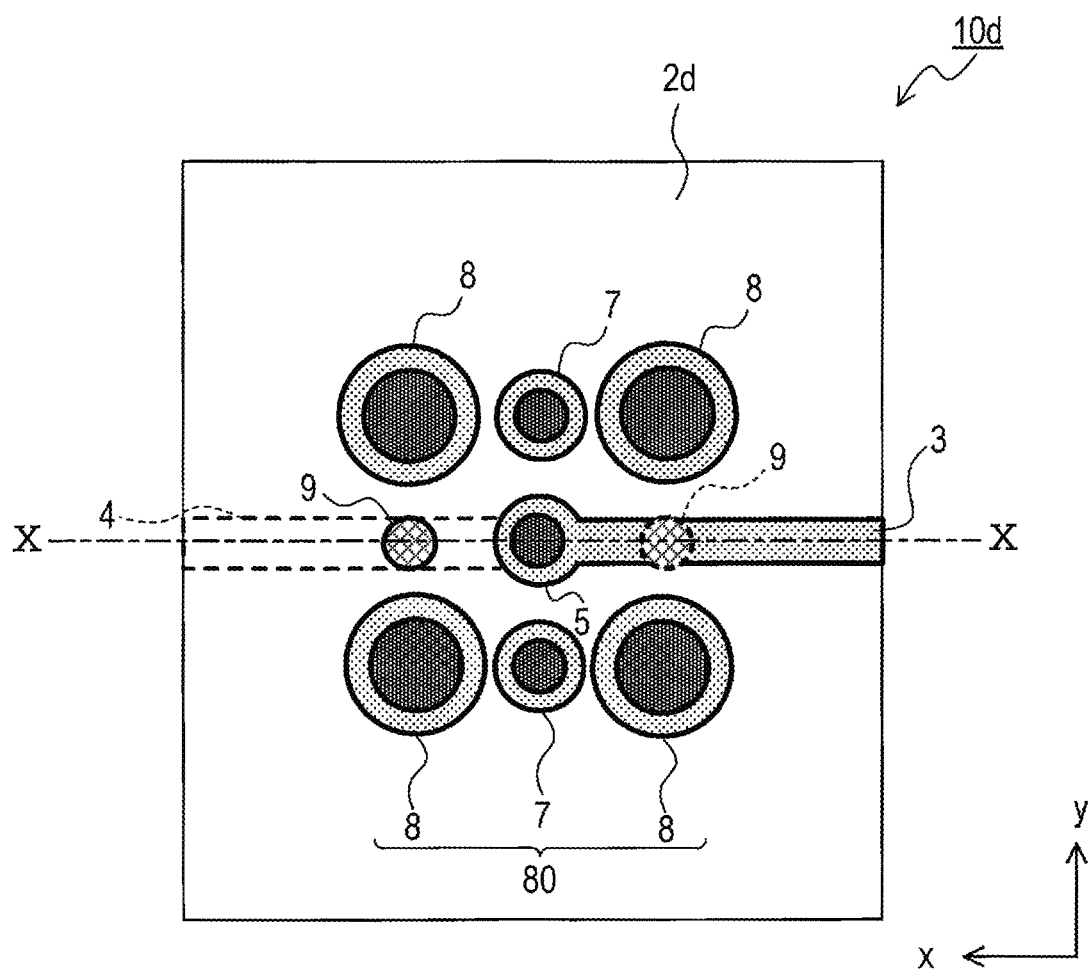
FIG. 9 is a plan view of a high-frequency transmission line according to a fifth embodiment.
Figure 10:
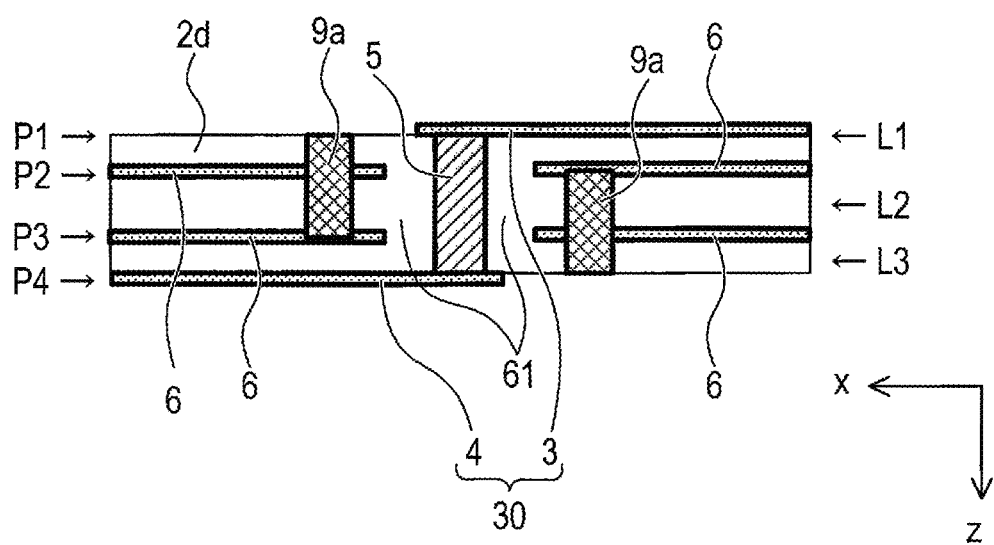
FIG. 10 is a cross-section view taken along line X-X in FIG. 9.

As shown in FIG. 9 and FIG. 10, in the multi-layer substrate 2d, two inter-layer vias 9 are formed for each line portion 30. One of the two inter-layer vias 9 is arranged in a position that overlaps the signal line 3 on an xy plane, and the remaining one is arranged in a position that overlaps the signal line 4.

The inter-layer via 9 that is arranged in the position that overlaps the signal line 3 is formed to pass through the dielectric layer L2, the ground plane 6 that is formed in the intermediate layer P3, and the dielectric layer L3, and provide electrical continuity between the two ground planes that are formed in the intermediate layers P2 and P3. Meanwhile, the inter-layer via 9 that is arranged in the position that overlaps the signal line 4 is formed to pass through the dielectric layer L1, the ground plane 6 that is formed in the intermediate layer P2, and the dielectric layer L2, and provide electrical continuity between the two ground planes that are formed in the intermediate layers P2 and P3. That is, the two inter-layer vias 9 are respectively formed to be exposed on the outer surface on a side opposite to that where the respective overlapping signal line 3 or 4 is located.

[5-2. Effects]

According to the fifth embodiment described above, the above-described effects (1) to (7) according to the first embodiment are obtained. In addition, as a result of the inter-layer vias 9 being added, transmission loss can be further reduced than that according to the first embodiment.

6. Sixth Embodiment

[6-1. Differences with the First Embodiment]

A basic configuration according to a sixth embodiment is similar to that according to the first embodiment. Therefore, descriptions of shared configurations are omitted. Differences will mainly be described. Here, reference numbers that are the same as those according to the first embodiment indicate the same configurations and preceding descriptions are referenced.

In the above-described high-frequency transmission line 10 according to the first embodiment, the three ground via portions 80 are formed to sandwich each of the two signal vias 5. In this regard, a high-frequency transmission line 10e according to the sixth embodiment differs from that according to the first embodiment in that three grooves 70 are formed to sandwich each of the two signal vias 5.

Figure 11:
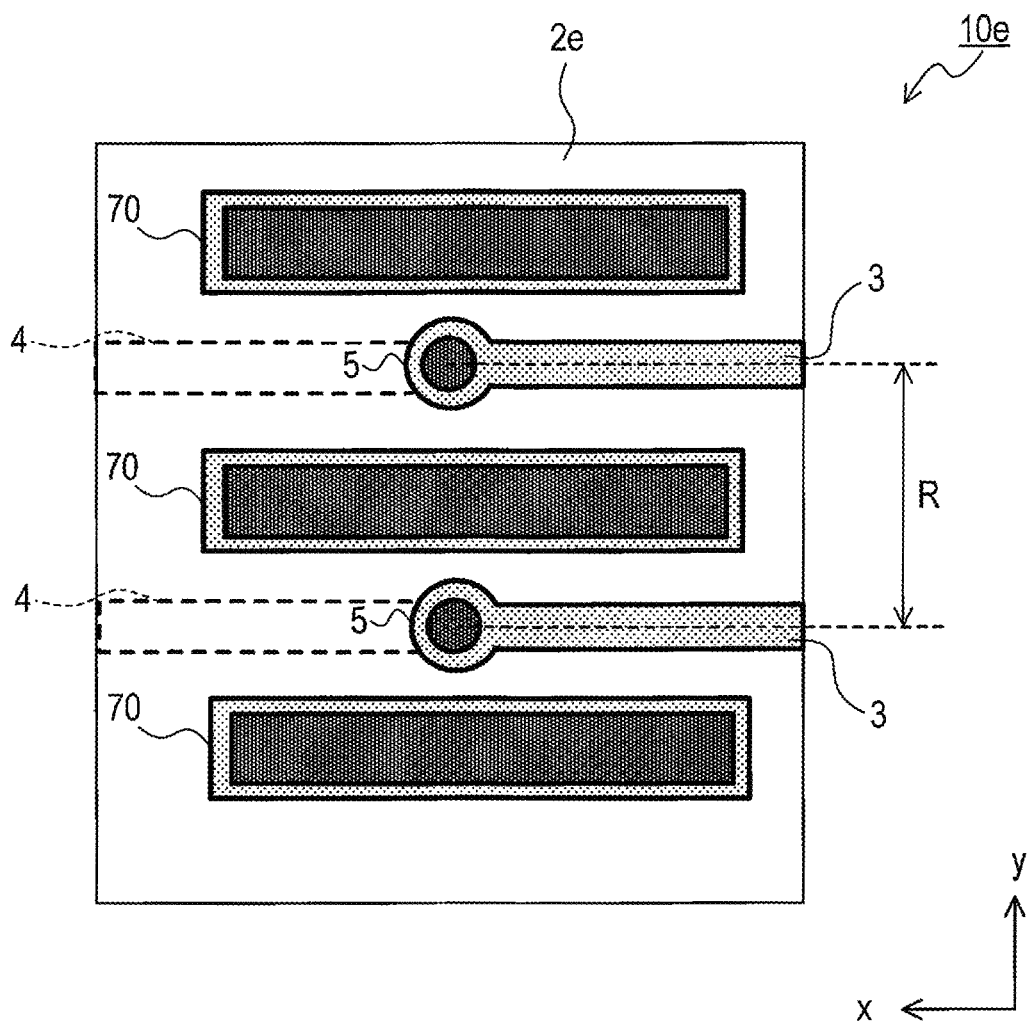
FIG. 11 is a plan view of a high-frequency transmission line according to a sixth embodiment.

As shown in FIG. 11, in the multi-layer substrate 2e, the three grooves 70 are formed such that a length direction is the x direction. Each of the three grooves 70 has a metal wall surface that passes through the multi-layer substrate 2e, and is formed into a rectangular cylindrical shape of which an xy cross-section is rectangular. Each groove 70 extends in the x direction with the vicinity of a position opposing the signal via 5 as the center. According to the present embodiment, the groove 70 corresponds to a metal portion.

[6-2. Effects]

According to the sixth embodiment described above, the above-described effects (1), and (5) to (7) according to the first embodiment are obtained.

OTHER EMBODIMENTS

Embodiments for carrying out the present disclosure are described above. However, the present disclosure is not limited to the above-described embodiments and can be carried out through various modifications.

(a) According to the above-described embodiments, the high-frequency transmission lines 10, and 10a to 10e that include the two signal vias 5 and the two line portions 30 are described. However, the high-frequency transmission lines 10, and 10a to 10e according to the embodiments may include three or more signal vias 5 and three or more line portions 30. When the high-frequency transmission lines 10, and 10a to 10e according to the embodiments include three or more signal vias 5 and three or more line portions 30, the high-frequency transmission lines 10, and 10a to 10e can also be applied to power supply of an antenna that has three or more antenna elements. In this case, the signal vias 5, the line portions 30, the ground via portions 80 or 80a, or the grooves 70 may be arranged side-by-side so as to be evenly spaced in the y direction.

(b) According to the above-described embodiments, the multi-layer substrates 2, and 2a to 2e that include two or three dielectric layers are described. However, a multi-layer substrate in which even more dielectric layers are laminated may be used. In this case, the configuration is similar to that according to the above-described embodiments, aside from an increase in the intermediate layer in which the ground plane 6 is formed.

(c) According to the above-described fourth and fifth embodiments, the inter-layer vias 9 are arranged only in positions that overlap the signal lines 3 and 4. However, the inter-layer vias 9 may be arranged in other positions.

(d) A plurality of functions provided by a single constituent element according to the above-described embodiments may be implemented by a plurality of constituent elements. A single function provided by a single constituent element may be implemented by a plurality of constituent elements. In addition, a plurality of functions provided by a plurality of constituent elements may be implemented by a single constituent element. A single function provided by a plurality of constituent elements may be implemented by a single constituent element. Furthermore, a part of a configuration according to the above-described embodiments may be omitted. Moreover, at least a part of a configuration according to an above-described embodiment may be added to or replace a configuration according to another of the above-described embodiments. Any mode included in the technical concept specified by the wordings of the scope of claims is an embodiment of the present disclosure.

(e) The present disclosure can also be implemented by various modes in addition to the above-described high-frequency transmission line, such as a radar system of which the high-frequency transmission line is a constituent element, a method for manufacturing the high-frequency transmission line, and the like.

What is claimed is:

1. A high-frequency transmission line comprising:
a multi-layer substrate that includes a plurality of dielectric layers that are laminated;
a plurality of line portions that are placed side-by-side in a direction that differs from a transmission direction that is set in advance, each of the plurality of line portions including a signal line that is formed along the transmission direction on each of two outer surfaces of the multi-layer substrate;
a plurality of signal vias, a signal via of the plurality of signal vias being arranged in each line portion of the plurality of line portions, and connecting between the signal lines that are respectively formed on the two outer surfaces;
a ground plane that is included in the multi-layer substrate, arranged between the plurality of dielectric layers, and covers peripheries of a plurality of transmission areas that are areas that center on each of the plurality of signal vias; and
a plurality of metal portions that, when a high-frequency signal that is transmitted through each of the plurality of line portions is transmitted through the transmission area corresponding to each of the plurality of line portions, confine the high-frequency signal in the transmission area,
wherein
the plurality of metal portions pass through at least a single dielectric layer in a lamination direction, are electrically continuous with the ground plane, and are provided to extend in the transmission direction, a single metal portion of the plurality of metal portions being arranged between two signal vias of the plurality of signal vias so as to sandwich each of the plurality of signal vias in a direction differing from the transmission direction;
each of the plurality of metal portions includes a plurality of ground vias that are placed side-by-side along the transmission direction;
no ground via surrounding a signal via of the plurality of signal vias overlaps any of the plurality of line portions on a same line along the transmission direction;
the plurality of ground vias include a plurality of types of ground vias, the plurality of types of ground vias each having diameters that differ from each other;
a portion of the plurality of ground vias that are included in each of two metal portions that sandwich a single signal via is arranged on a circle that is centered on the signal via; and
a radius of the circle that is centered on the signal via is equal to or less than an interval between centers of adjacent signal vias among the plurality of signal vias, the interval being equal to or less than a half of a wavelength of the high-frequency signal.

2. The high-frequency transmission line according to claim 1, wherein:
the plurality of types of ground vias include a small ground via and a large ground via of which the diameter is greater than that of the small ground via;
the plurality of signal vias are arranged in a row; and
a plurality of small ground vias that are included in the plurality of metal portions are arranged to sandwich each of the plurality of signal vias in the row in which the plurality of signal vias are arranged.

3. The high-frequency transmission line according to claim 2, wherein:
the two metal portions that sandwich a single signal via are formed to be linearly symmetrical with the signal line that is connected to the signal via.

4. The high-frequency transmission line according to claim 1, wherein:
a frequency of the high-frequency signal is equal to or greater than 50 GHz.

5. The high-frequency transmission line according to claim 4, wherein:
an interval between adjacent signal vias among the plurality of signal vias is an interval that is equal to or less than a half of a wavelength of the high-frequency signal.

6. The high-frequency transmission line according to claim 1, wherein:
the plurality of metal portions and the plurality of line portions are not positioned on a same plane that is defined by the transmission direction and the lamination direction.

7. The high-frequency transmission line according to claim 6, wherein:
each of the plurality of signal vias are sandwiched in a direction differing from the transmission direction such that a center of each of the plurality of signal vias and centers of a pair of metal portion are arranged to be colinear.

8. The high-frequency transmission line according to claim 1, wherein:
two metal portions that sandwich a single signal via are formed to be linearly symmetrical with the signal line that is connected to the signal via.

9. The high-frequency transmission line according to claim 1, wherein:
an interval between adjacent signal vias among the plurality of signal vias is an interval that is equal to or less than a half of a wavelength of the high-frequency signal.

10. The high-frequency transmission line according to claim 1, wherein:
a first signal line is on a first outer surface of the two outer surfaces of the multi-layer substrate;
a second signal line is on a second outer surface of the two outer surfaces of the multi-layer substrate;
the signal via connects a tip end of the first signal line and a tip end of the second signal line; and
the tip end of the first signal line and the tip end of the second signal line are opposite to each other at opposite ends of the signal via.

11. A high-frequency transmission line comprising:
a multi-layer substrate that includes a plurality of dielectric layers that are laminated;
a plurality of line portions that are placed side-by-side in a direction that differs from a transmission direction that is set in advance, each of the plurality of line portions including a signal line that is formed along the transmission direction on each of two outer surfaces of the multi-layer substrate;
a plurality of signal vias, a signal via of the plurality of signal vias being arranged in each line portion of the plurality of line portions, and connecting between the signal lines that are respectively formed on the two outer surfaces;

a ground plane that is included in the multi-layer substrate, arranged between the plurality of dielectric layers, and covers peripheries of a plurality of transmission areas that are areas that center on each of the plurality of signal vias; and a plurality of metal portions that, when a high-frequency signal that is transmitted through each of the plurality of line portions is transmitted through the transmission area corresponding to each of the plurality of line portions, confine the high-frequency signal in the transmission area, wherein:

the plurality of metal portions pass through at least a single dielectric layer in a lamination direction, are electrically continuous with the ground plane, are formed along the transmission direction, and are arranged so as to sandwich each signal via of the plurality of signal vias;

the each signal via of the plurality of signal vias forms a quasi-coaxial line structure with two metal portions of the plurality of metal portions sandwiching the each signal via of the plurality of signal vias;

at least a part of the plurality of metal portions are arranged between two adjacent signal lines formed by the plurality of line portions and are shared by two adjacent quasi-coaxial line structures formed by the plurality of signal vias;

each of the plurality of metal portions includes a plurality of ground vias that are placed side-by-side along the transmission direction;

no ground via surrounding a signal via of the plurality of signal vias overlaps any of the plurality of line portions on a same line along the transmission direction;

the plurality of ground vias include a plurality of types of ground vias, the plurality of types of ground vias each having diameters that differ from each other;

a portion of the plurality of ground vias that are included in each of two metal portions that sandwich a single signal via is arranged on a circle that is centered on the signal via; and a radius of the circle that is centered on the signal via is equal to or less than an interval between centers of adjacent signal vias among the plurality of signal vias, the interval being equal to or less than a half of a wavelength of the high-frequency signal.

12. A high-frequency transmission line comprising:

a multi-layer substrate that includes a plurality of dielectric layers that are laminated;

a plurality of line portions that are placed side-by-side in a direction that differs from a transmission direction that is set in advance, each of the plurality of line portions including a signal line that is formed along the transmission direction on each of two outer surfaces of the multi-layer substrate;

a plurality of signal vias, a signal via of the plurality of signal vias being arranged in each line portion of the plurality of line portions, and connecting between the signal lines that are respectively formed on the two outer surfaces;

a ground plane that is included in the multi-layer substrate, arranged between the plurality of dielectric layers, and covers peripheries of a plurality of transmission areas that are areas that center on each of the plurality of signal vias; and a plurality of metal portions that, when a high-frequency signal that is transmitted through each of the plurality of line portions is transmitted through the transmission area corresponding to each of the plurality of line portions, confine the high-frequency signal in the transmission area, wherein:

the plurality of metal portions pass through at least a single dielectric layer in a lamination direction, are electrically continuous with the ground plane, are formed along the transmission direction, and are arranged in an alternating manner with each of the plurality of signal vias so as to sandwich each of the plurality of signal vias in a direction differing from the transmission direction;

each of the plurality of metal portions includes a plurality of ground vias that are placed side-by-side along the transmission direction;

the plurality of ground vias include a plurality of types of ground vias of which diameters differ from each other;

a portion of the ground vias that are included in each of two metal portions that sandwich a single signal via is arranged on a circle that is centered on the signal via;

the plurality of types of ground vias include a small ground via and a large ground via of which a diameter of the large ground via is greater than that of the small ground via;

the plurality of signal vias are arranged in a row;

a plurality of small ground vias that are included in the plurality of metal portions are arranged to sandwich each of the plurality of signal vias in the row in which the plurality of signal vias are arranged;

no ground via surrounding a signal via of the plurality of signal vias overlaps any of the plurality of line portions on a same line along the transmission direction;

the plurality of ground vias include a plurality of types of ground vias, the plurality of types of ground vias each having diameters that differ from each other; and a portion of the plurality of ground vias that are included in each of two metal portions that sandwich a single signal via is arranged on a circle that is centered on the signal via; and a radius of the circle that is centered on the signal via is equal to or less than an interval between centers of adjacent signal vias among the plurality of signal vias, the interval being equal to or less than a half of a wavelength of the high-frequency signal.

\* \* \* \* \*